(12) United States Patent
Beyne et al.

(10) Patent No.: US 9,508,665 B2
(45) Date of Patent: Nov. 29, 2016

(54) METHOD FOR INSERTION BONDING AND DEVICE THUS OBTAINED

(75) Inventors: Eric Beyne, Leuven (BE); Paresh Limaye, Leuven (BE)

(73) Assignees: IMEC, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 12/831,919

(22) Filed: Jul. 7, 2010

(65) Prior Publication Data

US 2011/0027967 A1 Feb. 3, 2011

Related U.S. Application Data

(60) Provisional application No. 61/224,279, filed on Jul. 9, 2009.

(30) Foreign Application Priority Data

Jul. 8, 2009 (EP) .................................. 09164943

(51) Int. Cl.
*H01L 21/30* (2006.01)
*H01L 23/00* (2006.01)
(Continued)

(52) U.S. Cl.
CPC ............... *H01L 24/11* (2013.01); *H01L 24/13* (2013.01); *H01L 24/81* (2013.01); *H01L 25/0657* (2013.01); *H01L 25/50* (2013.01); *H01L 2224/03912* (2013.01); *H01L 2224/0401* (2013.01); *H01L 2224/1147* (2013.01); *H01L 2224/13099* (2013.01); *H01L 2224/81136* (2013.01); *H01L 2224/81203* (2013.01); *H01L 2224/81801* (2013.01); *H01L 2225/06513* (2013.01); *H01L 2924/014* (2013.01); *H01L 2924/0105* (2013.01); *H01L 2924/01006* (2013.01); *H01L 2924/01013* (2013.01); *H01L 2924/01015* (2013.01);
(Continued)

(58) Field of Classification Search
USPC ................. 438/597, 107, 613; 257/E21.499, 257/E21.597
See application file for complete search history.

(56) References Cited

U.S. PATENT DOCUMENTS 4,816,426 A * 3/1989 Bridges et al. ................. 29/827
5,219,787 A * 6/1993 Carey ............... H01L 21/31144
257/E21.257

(Continued)

OTHER PUBLICATIONS

European Search Report mailed on Nov. 6, 2009 in European Patent Application 09164943.4.

(Continued)

*Primary Examiner* — Bradley K Smith
*Assistant Examiner* — David Goodwin
(74) *Attorney, Agent, or Firm* — Knobbe, Martens, Olson & Bear LLP

(57) ABSTRACT

A method for insertion bonding and a device thus obtained are disclosed. In one aspect, the device includes a first substrate having a front main surface and at least one protrusion at the front main surface. The device includes a second substrate having a front main surface and at least one hole extending from the front main surface into the second substrate. The protrusion of the first substrate is inserted into the hole of the second substrate. The hole is formed in a shape wherein the width is reduced in the depth direction and wherein the width of at least a part of the hole is smaller than the width of the protrusion at the location of the metal portion thereof. The protrusion is deformed during insertion thereof in the hole to provide a bond between the part of the hole and the metal portion.

19 Claims, 8 Drawing Sheets

(51) Int. Cl.
*H01L 25/065* (2006.01)
*H01L 25/00* (2006.01)

(52) U.S. Cl.
CPC ............... *H01L 2924/01022* (2013.01); *H01L 2924/01027* (2013.01); *H01L 2924/01029* (2013.01); *H01L 2924/01032* (2013.01); *H01L 2924/01033* (2013.01); *H01L 2924/01046* (2013.01); *H01L 2924/01049* (2013.01); *H01L 2924/01075* (2013.01); *H01L 2924/01079* (2013.01); *H01L 2924/10329* (2013.01); *H01L 2924/1461* (2013.01)

(56) References Cited

U.S. PATENT DOCUMENTS

| | | | | |
|---|---|---|---|---|
| 5,229,647 | A * | 7/1993 | Gnadinger | 257/785 |
| 5,329,423 | A * | 7/1994 | Scholz | 361/760 |
| 6,478,212 | B1 * | 11/2002 | Engel et al. | 228/5.7 |
| 6,732,908 | B2 * | 5/2004 | Furman et al. | 228/180.22 |
| 6,884,313 | B2 * | 4/2005 | Liu et al. | 156/292 |
| 6,936,913 | B2 * | 8/2005 | Akerling et al. | 257/686 |
| 7,126,224 | B2 * | 10/2006 | Akram | 257/774 |
| 7,969,016 | B2 * | 6/2011 | Chen et al. | 257/777 |
| 8,309,396 | B2 * | 11/2012 | Ching | 438/108 |
| 8,330,480 | B2 * | 12/2012 | Shioga | G01R 1/07378 324/750.16 |
| 2002/0000829 | A1 * | 1/2002 | Akram et al. | 324/765 |
| 2006/0170112 | A1 | 8/2006 | Tanaka et al. | |
| 2006/0281219 | A1 | 12/2006 | Trezza | |
| 2007/0099449 | A1 | 5/2007 | Suzuki et al. | |
| 2007/0210425 | A1 | 9/2007 | Ramakrishna et al. | |
| 2008/0026318 | A1 * | 1/2008 | Schultz et al. | 430/270.1 |
| 2009/0163019 | A1 * | 6/2009 | Srivastava et al. | 438/612 |
| 2010/0038778 | A1 * | 2/2010 | Lee et al. | 257/737 |
| 2010/0320575 | A9 * | 12/2010 | Chauhan | 257/621 |

OTHER PUBLICATIONS

Tanaka et al., Low-Cost Through-hole Electrode Interconnection for 3D-SiP Using Room-temperature Bonding, IEEE Electronic Components and Technology Conference 2006, p. 814-818.

* cited by examiner

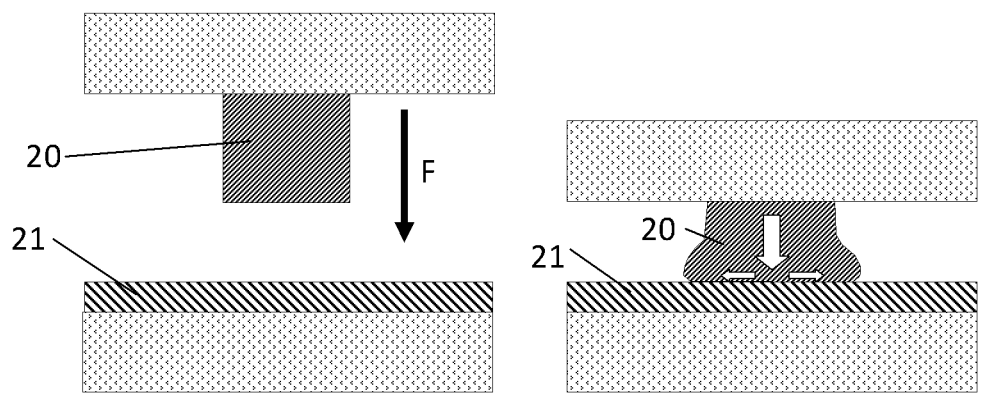
FIG. 2 – Prior art
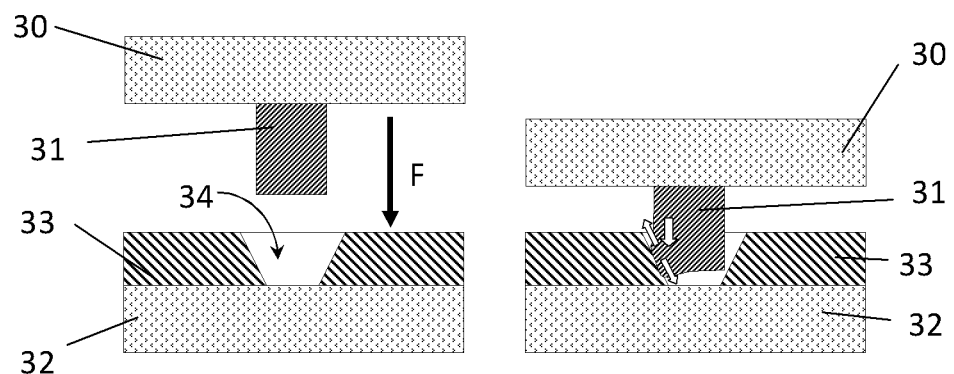
FIG. 3

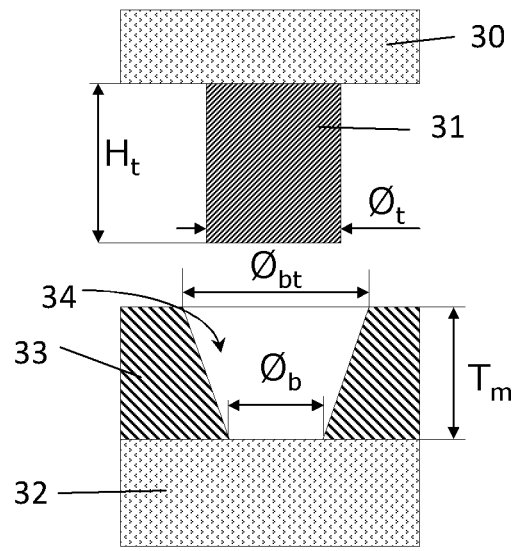
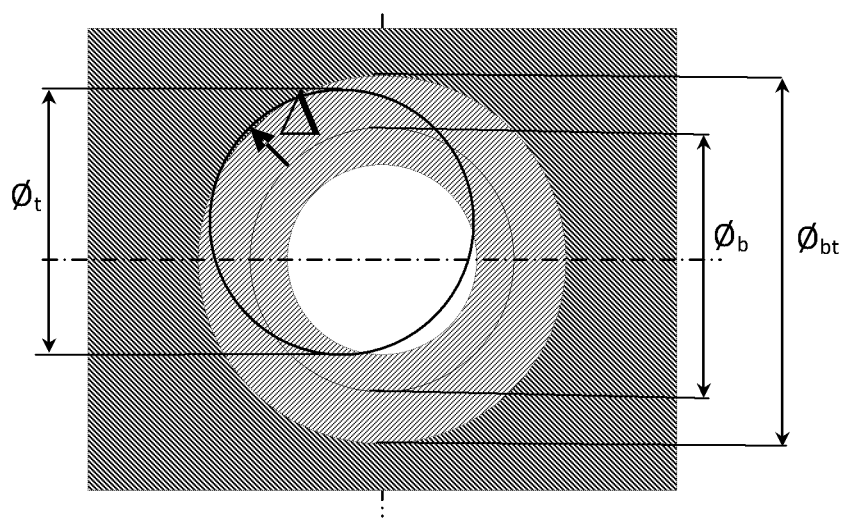
FIG. 4
FIG. 5

METHOD FOR INSERTION BONDING AND DEVICE THUS OBTAINED

CROSS REFERENCE TO RELATED APPLICATIONS

This application claims priority under 35 U.S.C. §119(e) to U.S. provisional patent application 61/224,279 filed on Jul. 9, 2009, which application is hereby incorporated by reference in its entirety.

BACKGROUND OF THE INVENTION

Field of the Invention

The present disclosure relates to a method of aligning and bonding a first substrate and a second substrate for the fabrication of a semiconductor device. The disclosure also relates to semiconductor device aligned and bonded according to the method.

Description of the Related Technology

In one aspect, the present disclosure applies to the field of 3D thin die packaging or multiple thin IC (devices) packaging in the semiconductor industry. The assembly of semiconductor devices in three dimensions (3D) is an enabler for advanced scaling and integration of components, especially in case of heterogeneous components, for instance logic, memory and transducers, etc.

Often multiple metal "pads" or "bumps" need to be electrically joined to opposing parallel surfaces (metal to metal joining). The currently applied processes for the assembly of semiconductor devices typically involve wire bonding and/or welding and/or gluing the devices.

In a typical wire bonding process wires are bonded to a number of stacked substrates in order to provide electrical connectivity. The wire bonding process is time consuming, relatively complex, and enables only a limited wiring density between the dies. Furthermore, the wire bonding process results in a structure having an essentially "pyramidal" shape, which reduces the useful area of the dies.

Alternatives for the wire bonding processes may be welding and/or gluing processes. Examples are thermo-compression bonding of metals and welding. These assembly processes typically occur under high forces and/or at high temperatures, for instance ranging from 150° C. up to 350° C. These temperatures may be too high for devices in certain applications, such as advanced memory chips and MEMS devices. For some applications the metal-to-metal joining needs to be done at low temperature, much below the melting temperature of the metals, without the use of intermediate soldering metals. Also low pressure is needed for some applications.

An example of such an application is the field of three dimensional (3D) integration. 3D ICs provide a way of integration that would enable high performance, compact System-on-chips (SoCs). Fabrication of 3D ICs 15 involves stacking of a first chip 10 on a second chip 11 such that FEOL (front end of line) and BEOL (back end of line) structures on both (or more) these chips 10, 11 are connected using Through Silicon Vias (TSV) 12 as shown in FIG. 1. Through Silicon Vias (TSV) 12 form an interconnect component connecting the different dies 10, 11 of the 3D IC.

Traditional thermo-compression bonding consists of mating a metal bump structure 20 to a flat metal surface 21 by applying a perpendicular force F on the joint that causes the bump structure 20 to deform. As a result of the small plastic flow during deformation, an intimate metal-metal contact is obtained at the joining interface. Adsorbed molecules and possible surface oxides are removed by tangential deformations caused by shear forces at the contact surface. This is illustrated in FIG. 2, where the left hand side illustrates the situation before thermo-compression, and the right hand side illustrates the situation after thermo-compression.

Tanaka et al. describe in "Low-cost Through-hole Electrode Interconnection for 3D-SiP Using Room-temperature Bonding", IEEE, Electronic Components and Technology Conference 2006, p. 814-818, a method for making through-hole electrode interconnections by a mechanical caulking operation. Multiple through-hole electrodes are formed on the backside of a lower chip. Gold stud bumps on the upper chips are pressed into the through-hole electrodes on the lower chips by applying a compressive force, which causes the gold bump to plastically deform. A contact force is generated at the interface between the bumps and the electrodes on the sidewall of the through-holes. The bumps have a degrading dimension in a direction from the substrate to the tip of the bump.

In US20060170112, a method of joining parts using large stud bumps (made by a Au-wire bonder) on one surface and gold-metalized pits on the other surface is described. The joining is performed by pushing and deforming the Au stud bumps in the mating holes of the bottom substrate. During this action, the plastic flow of the metal bump allows for a tight filling, "caulking", of the bottom hole, realizing an intimate metal-metal contact between the two parts. This method requires large Au bumps, large deformations and deep holes in the mating substrate. These holes are characterized by a diameter smaller than the Au bumps, having vertical side-wall profiles.

SUMMARY OF CERTAIN INVENTIVE ASPECTS

Certain inventive aspects relate to a good electrical metal/metal contact without requiring high temperatures nor high forces.

In a first aspect, the present disclosure provides a method of bonding at least a first substrate to a second substrate. The method comprises providing a first substrate, the first substrate having a front main surface and at least one protrusion at the front main surface, the protrusion comprising at least a metal portion, the protrusion having side walls which are substantially perpendicular to the front main surface of the first substrate. The method further comprises providing a second substrate, the second substrate having a front main surface and at least one hole extending into the second substrate, the at least one hole comprising a metal layer on at least part of the inner surface of the hole, the at least one hole being shaped such that at least one of its dimensions in a cross-section substantially parallel with the front main surface of the second substrate is reduced in a depth direction. The method further comprises the hole and the protrusion being shaped so that at least one dimension of the hole in a cross-section substantially parallel to the front main surface of the second substrate is smaller than the corresponding dimension of the corresponding protrusion, in a cross-section substantially parallel to the front main surface of the first substrate. The method further comprises aligning the at least one protrusion of the first substrate with a corresponding at least one hole of the second substrate. The method further comprises clamping the first and second substrate by inserting the at least one protrusion of the first substrate into the at least one hole of the second substrate, the protrusion being arranged and constructed to be deformed during insertion thereof in the hole so as to provide a bond between the sidewall of the hole and the metal portion of the protrusion.

It is an advantage of embodiments of the present disclosure that thin metallization pads can be used as a metal layer on the second substrate, in which metallization pads holes corresponding to protrusions on the first substrate can be provided. Furthermore, protrusions can have limited height. Embodiments of the present disclosure take into account alignment precision by using sloped wall profiles of bottom mating surfaces.

In a method according to embodiments of the present disclosure, the protrusion and the hole may be configured so as to provide a metallic bond between the metal of the protrusion and the metal of the hole. This allows a good and reliable connection between the first and the second substrate.

In a method according to embodiments of the present disclosure, at least one protrusion may be made of metal and the metal portion may be formed by the protrusion itself. Making the protrusion completely from metal reduces the number of steps in the fabrication thereof. In embodiments of the present disclosure, the metal portion of at least one of the protrusions may be formed by a metal surface layer.

At least one of the holes in the second substrate may be a blind hole, i.e. a hole which is closed at its bottom end. At least one of the holes in the second substrate may be a through-hole. Blind holes and through-holes may be combined in one and the same second substrate, depending on the requirements or technical considerations of the circuits to be implemented.

In a method according to embodiments of the present disclosure, the friction of the protrusion along the metalized inner surface of the hole may cause bonding by plastic deformation action.

In a method according to embodiments of the present disclosure, the metal of the protrusion and/or the metal layer of the hole may be metal from the group consisting of Au, Ni, Pd, Co, Cu.

In a method according to embodiments of the present disclosure, the second substrate may have a back main surface opposite the front main surface, wherein the hole tapers off from the front main surface to the back main surface.

In a method according to embodiments of the present disclosure, the protrusion may be essentially cylindrical. Such protrusion is easy to manufacture using standard processing.

In a method according to embodiments of the present disclosure, the hole may be essentially conical. Such hole is easy to manufacture using standard processing.

In a method according to embodiments of the present disclosure, the diameter of the protrusion may be smaller than the entrance diameter and larger than a further diameter of the hole, a further diameter being defined as a diameter between the entrance diameter and a bottom diameter. This allows to correct for alignment inaccuracies. The height of the protrusion on the first substrate may be larger than the depth of the hole in the second substrate, for allowing a firm bond between the protrusion and the hole.

A method according to embodiments of the present disclosure may furthermore comprise forming a gap between the back main surface of the second substrate and the front main surface of the first substrate. In embodiments of the present disclosure, the gap between the first and second substrates may at least be partly filled with a filler material after having bonded the substrates, for instance a polymer (underfill) material. Adding the filler material may improve the reliability and the strength of the interconnect formed by the protrusion and the hole. Another advantage is that the filler material may be arranged in the gap to provide a thermal contact between the wafers or dies in the stack formed by the first and second substrates.

In a method according to embodiments of the present disclosure, the maximum diameter of the protrusion in a cross-section parallel to the front main surface of the first substrate may be between about 1 µm and 15 µm larger than the minimum diameter of the hole. This provides a good bond between the protrusion and the sidewalls of the hole.

A method according to embodiments of the present disclosure may comprise repeating the operations as in any of the method embodiments to form a stack of three or more substrates.

A method according to embodiments of the present disclosure may comprise aligning and bonding one or more singulated dies and a wafer. In alternative embodiments, a method may comprise aligning and bonding a plurality of wafers. In yet alternative embodiments, a method may comprise aligning and bonding a plurality of dies.

A method according to embodiments of the present disclosure involves low cost processing steps (simple alignment and bonding steps) and a low level of complexity, while still allowing for a high interconnect density.

It is an advantage of embodiments of the present disclosure that parts with multiple metal pads or bumps on opposing parallel surfaces are joined, where the bond is performed by metal-to-metal joining at low temperature, below the melting temperature of the metals, without the use of intermediate soldering materials. This allows to use the process for joining semiconductor devices which at higher temperatures would be degraded, damaged or destroyed.

In a second aspect, the present disclosure provides a semiconductor device, comprising a first substrate with at least one protrusion, the first substrate having a front main surface and the protrusion being formed at the front main surface and comprising a metal portion, and a second substrate having a front main surface, the second substrate comprising at least one hole extending from the front main surface into the second substrate, the hole having on at least a part of the inner surface thereof a metal layer. The at least one protrusion of the first substrate is inserted into a corresponding at least one hole of the second substrate. The hole is formed in a shape wherein the width is reduced in the depth direction and wherein the width of at least a part of the hole is smaller than the width of the protrusion at the location of the metal portion thereof. The protrusion is deformed during insertion thereof in the hole so as to provide a bond between the part of the hole and the metal portion.

In embodiments of the present disclosure, the protrusion and hole are configured as to provide a metallic bond between the metal of the protrusion and the metal of the hole.

In embodiments of the present disclosure, the metal portion of at least one protrusion is essentially the protrusion itself. In same or alternative embodiments, the metal portion of the at least one protrusion is a metal surface layer.

At least one of the holes in the second substrate may be a blind hole. In same or alternative embodiments, at least one of the holes in the second substrate is a through-hole.

In a semiconductor device according to embodiments of the present disclosure, the protrusion is bonded to the hole by plastic deformation action.

The metal of the protrusion and/or the metal of the hole may comprise metal from the group consisting of Au, Ni, Pd, Co, and Cu.

In a semiconductor device according to embodiments of the present disclosure, the second substrate has a back main surface opposite the front main surface, and the hole is shaped so as to taper from the front main surface to the back main surface. The hole may essentially form a truncated cone.

In a semiconductor device according to embodiments of the present disclosure, the protrusion may be essentially cylindrical.

The height of the protrusion on the first substrate may be larger than the depth of the hole in the second substrate.

In a semiconductor device according to embodiments of the present disclosure, the first and second substrates are mutually bonded only by their protrusions and holes.

In a semiconductor device according to embodiments of the present disclosure, the second substrate may comprise a back main surface opposite the front main surface, and the semiconductor device may comprise a gap between the back main surface of the second substrate and the front main surface of the first substrate. The height of this gap may vary slightly, due to the different process tolerances on the depths of the holes, the height of the protrusions and/or any height changes that occur during the bonding process. Optionally, at least a part of the gap may be filled with a filler material, for instance a polymer (underfill) material. The underfill material may be dispensed in the gap between the back main surface of the second substrate and the front main surface of the first substrate, after having bonded both substrates.

The first and second substrates may be one or more singulated dies and a semiconductor wafer. Alternatively, the first and second substrates may be semiconductor wafers. In still other embodiments, the substrates may be dies.

The protrusion may form an electrical interconnect between the stacked substrates.

Particular and preferred aspects of the disclosure are set out in the accompanying independent and dependent claims. Features from the dependent claims may be combined with features of the independent claims and with features of other dependent claims as appropriate and not merely as explicitly set out in the claims.

Certain objects and advantages of the disclosure have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

The following detailed description of embodiments of the present disclosure will be better understood when read in conjunction with the appended drawings. Further characteristics, advantages and details of the present disclosure will become apparent from this description. Furthermore, it is to be understood that the present disclosure is illustrated by way of example only and is neither limited by the description nor by the accompanying figures, in which like references indicate the same or similar elements.

In the description of the embodiments reference is made to the following drawings, in which:

FIG. 2 illustrates prior art thermo-compression bonding.

FIG. 3 illustrates insertion thermo-compression bonding according to an embodiment of the present disclosure.

FIG. 4 illustrates a cross-sectional side view of the geometrical configuration of bump structure and hole for a metal-metal insertion bonding process according to embodiments of the present disclosure.

FIG. 5 illustrates a top view of the geometrical configuration as illustrated in FIG. 4.

Figure 1:
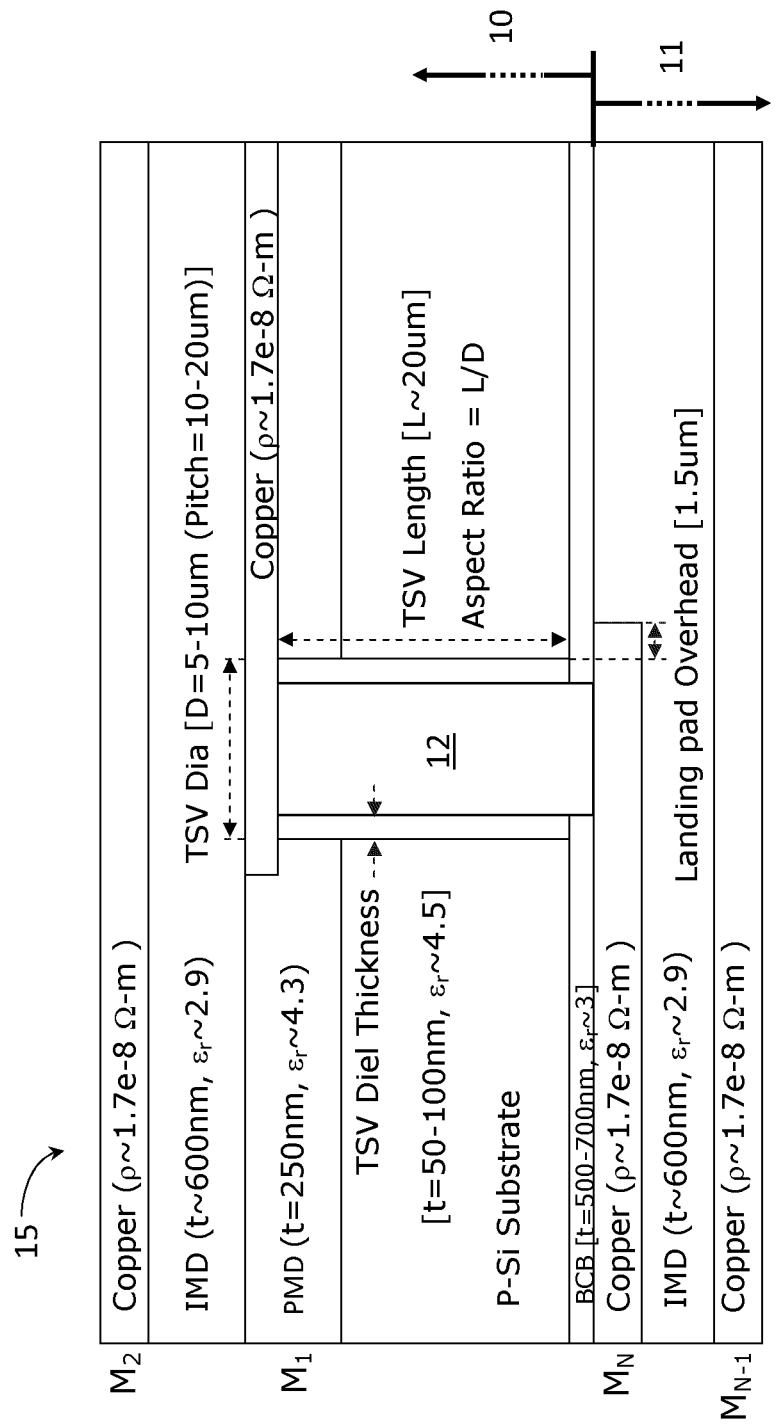
FIG. 1 is a 2D view of a 3D-SIC TSV architecture.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The present disclosure will be described with respect to particular embodiments and with reference to the drawings. The drawings are intended to be only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements or operations and not necessarily for describing a sequential or chronological order. For instance, if a first element is described as being placed on a second element, it is to be understood that this also encompasses the second element being placed on the first element. More generally, it is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

Furthermore, the terms chip, die, wafer, substrate and the like in the description are used for descriptive purposes and are examples of the first and second substrate defined in the appended claims. The term substrate as defined herein not only refers to the base substrate or base element of a semiconductor device (chip), but also to all substrate layers (e.g. insulating layers and wiring layers) defining electronic circuits therein that have been provided thereon. For instance, a substrate includes the thin-film laminated body provided on a base element.

The terms rod, post, pillar, stud, plug and the like are used for descriptive purposes and are examples of the protrusion extending from a substrate and forming (a part of) the interconnect between the substrates. The same applies to the words cavity, via and the like, which are examples of the term "hole" as used herein.

Furthermore, while some embodiments described herein include some but not other features included in other embodiments, combinations of features of different embodiments are intended to be within the scope of the disclosure, and form different embodiments, as would be understood by those skilled in the art. For example, in the appended claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure the understanding of this description.

A method according to certain embodiments of the present disclosure aims at greatly improving the shear deformation at the metal/metal interface by using a contact of the bump to a sloped surface, rather than a flat surface.

A method according to embodiments of the present disclosure is illustrated in FIG. 3, where the left hand side illustrates the situation before compression bonding, and the right hand side illustrates the situation during performance of the method according to embodiments of the present disclosure. A first substrate 30 is provided with a protrusion, also called metal bump structure 31 hereinafter. The term "substrate" may include any underlying material or materials that may be used, or upon which a metal bump structure 31 may be formed. In embodiments of the present disclosure, this "substrate" may include a semiconductor substrate such as e.g. silicon, a gallium arsenide (GaAs), a gallium arsenide phosphide (GaAsP), an indium phosphide (InP), a germanium (Ge), or a silicon germanium (SiGe) substrate. The "substrate" may include for example one or more insulating layers such as $SiO_2$ or a $Si_3N_4$ layers in addition to a semiconductor substrate portion. The "substrate" may also include for example one or more conductive layers such as copper layers in addition to a semiconductor substrate portion. The term "substrate" is thus used to define generally the elements for layers and components that underlie a layer or portions of interest, in particular a metal bump structure 31. Also, the "substrate" may be any other base on which a metal bump structure 31 is formed, for example a glass, quartz, fused silica or metal foil. In embodiments of the present disclosure the substrate may be a singulated die from a wafer, an entire wafer or any other type of substrate.

The first substrate 30 has a front side and a back side. The substrate 30 is provided at the front side thereof with one or more posts or protrusions 31. In the embodiment shown the protrusion 31 has a rod-like shape, but other shapes are also possible as will be described hereafter. The protrusion 31 may for instance be electro-plated, but any other process for providing protrusions 31 on a substrate 30 are feasible as well. The protrusion 31 may be made of any material, metal or non-metal. The protrusion 31 should include a metal portion, for instance a metal layer applied on its outer surface. In other embodiments the protrusion 31 is entirely made of metal. The metal portion may be any part of the protrusion or even the entire protrusion itself.

In further embodiments the material of the protrusion 7 (or the layer provided on the protrusion) is metal selected from the group consisting of Au, Ni, Pd, Co, and, preferably, copper (Cu). The protrusion 31 may for example be a metal plated bump structure. In alternative embodiments, the metal bump structure 31 may be a TSV (through-substrate via), e.g. a Cu-nail TSV.

The first substrate 30 with the metal bump structure 31 is mated to a second substrate 32 with a layer 33 in which a hole 34 mating to the bump structure 31 has been defined. The hole 34 has sloped sidewalls, i.e. sidewalls which are not substantially perpendicular to the plane of the substrate 32. The slope of the sidewalls is such that the hole 34 has smaller dimensions at the level of the substrate 32 than at a level away from the substrate. The second substrate 32 may be any kind of substrate as defined with respect to the first substrate 30. The second substrate has a front main surface and a back main surface. The first and second substrates may be of a similar kind, or they may be different. In embodiments of the present disclosure, the layer 33 may be a metal layer. In alternative embodiments, the layer 33 may be an insulating layer, which is at least partially covered by a metal layer. Such metal layer covering the insulating layer is at least provided at the inside walls of the mating hole 34. The mating hole 34 in the layer 33 is characterized by a sloped metal side wall surface, a bottom size smaller than the diameter of the mating bump structure 31 and a top surface opening slightly larger than the diameter of the bump structure 1, with an amount that compensates for alignment tolerances in placing the bump substrate 30 onto the mating substrate 32.

The shape of the bump structure 31 is typically cylindrical, i.e. circular in cross-section substantially parallel to the first substrate 30. However, other shapes in cross-section are also possible, such as for example elliptic or prismatic cross-sectional shapes in a direction parallel to the first substrate 30, as long as the shapes have at least one dimension in a cross-section substantially parallel to the first substrate 30 which is similar to or smaller than the height $H_t$ (see FIG. 4) of the bump structure 31 in order to reduce the mechanical stiffness of the bump structure 31. A high mechanical stiffness of the bump structure 31 would require larger forces during bonding to obtain a same plastic deformation of the bump structure 31. In FIG. 4, some dimensions of the mating structures are defined.

In particular embodiments, a bottom dimension $Ø_b$, i.e. a dimension at the level of the substrate 32, of the substrate hole 34 is smaller than the corresponding dimension $Ø_t$ of the bump structure 31: $Ø_b<Ø_t$. Corresponding dimensions are dimensions in a same direction once both substrates 30, 32 are attached to one another. In particular embodiments, all bottom dimensions of the hole are smaller than the corresponding dimensions of the bump structure 31. For example, in case of a cylindrical bump structure 31, the bottom diameter of the substrate hole 34 may be smaller than the diameter of the bump structure 31. In embodiments of the present disclosure, the sidewalls of the hole 34 are sloping with respect to the plane of the substrate 32, i.e. the hole 34 tapers off from the front main surface of the second substrate towards the bulk of the substrate. In particular embodiments, the sidewalls may be continuously sloping. In other embodiments the reduction of the width may be discontinuous, for instance stepwise. In particular embodiments of the present disclosure, the bump structure 31 is a straight structure in longitudinal direction, i.e. in a direction substantially perpendicular to the plane of the substrate 30. The height $H_t$ of the bump structure 31 is similar to or larger than the thickness $T_m$ of the layer 33, e.g. the metal pad thickness $H_t \geq T_m$. To allow for inaccuracies of the alignment of the first and second substrates 30, 32, the dimensions at the top of the substrate hole 34, i.e. the dimensions of the hole 34 at a level away from the substrate 32, e.g. the top diameter, is large enough to allow for insertion bonding, independent of the accuracy of a particular alignment. In particular for the embodiment with a cylindrical bump structure 31, $\varnothing_{bt} > \varnothing_t$. Given a predetermined alignment tolerance, $\Delta$, for a die-to-die, die-to-wafer or wafer-to-wafer bonding, the dimension as the top of the substrate hole, e.g. the diameter, should be at least $\varnothing_{bt} > \varnothing_t + 2\Delta$. In case of the hole being a truncated cone, this results in a slop of the metal in the hole equal to $\mathrm{atan}(T_m/\Delta) \sim T_m/\Delta$. A top view of the structures is shown in FIG. 5.

As a practical example, given an alignment tolerance $\Delta=1.5$ μm, a top protrusion diameter of $\varnothing_t=5$ μm and a bottom diameter of the hole $\varnothing_b=4$ μm, the diameter at the top of the hole should at least be $\varnothing_{bt}=\varnothing_t+2\Delta=8$ μm. Using a thickness of the bottom layer of $T_m=6$ μm, this would result in a slope of the metal sidewall of 72°. These dimensions are all within the window of practical fabrication methods.

During bonding, in view of the smaller cross-sectional dimension of the bump structure 31 compared to the dimension of the hole 34 at a level away from the second substrate 32, the at least partly metallised bump structure 31 first makes contact to a small part of the sloped sidewall of the metal surface of the mating hole 34. There is only a small contact area between both. Due to the contact on the sloped surface, the applied force F, which is applied perpendicularly to the plane of the second substrate 32, results locally in a very high stress, easily exceeding the yield stress of the bump structure 31. This stress translates into a high shear stress along the interface between the bump structure 31 and the conductive inner surface of the sidewalls of the hole 34, allowing for more easy plastic deformation at the contact area. As the bump structure 31 is pushed deeper into the mating hole 34, the contact area will gradually increase (in view of the dimensions of the hole 34 getting smaller closer to the second substrate 32) and the bump structure 31 will further deform plastically, finally resulting in a stable bond, in particular a stable metal-metal bond. The result is a more effective bonding than in a conventional thermo-compression approach, with, however, a somewhat smaller final contact area.

The smaller final contact area may cause a somewhat larger contact resistance (compared to thermo-compression bonding), however this is not very significant. In particular when the electrical, contact on the metal pad of the bottom die is parallel to its surface (Pad with side connections), the electrical resistance is dominated by the spreading of the current from the outer diameter of the metal-metal contact to the contact location on the pad surface.

Figure 9:
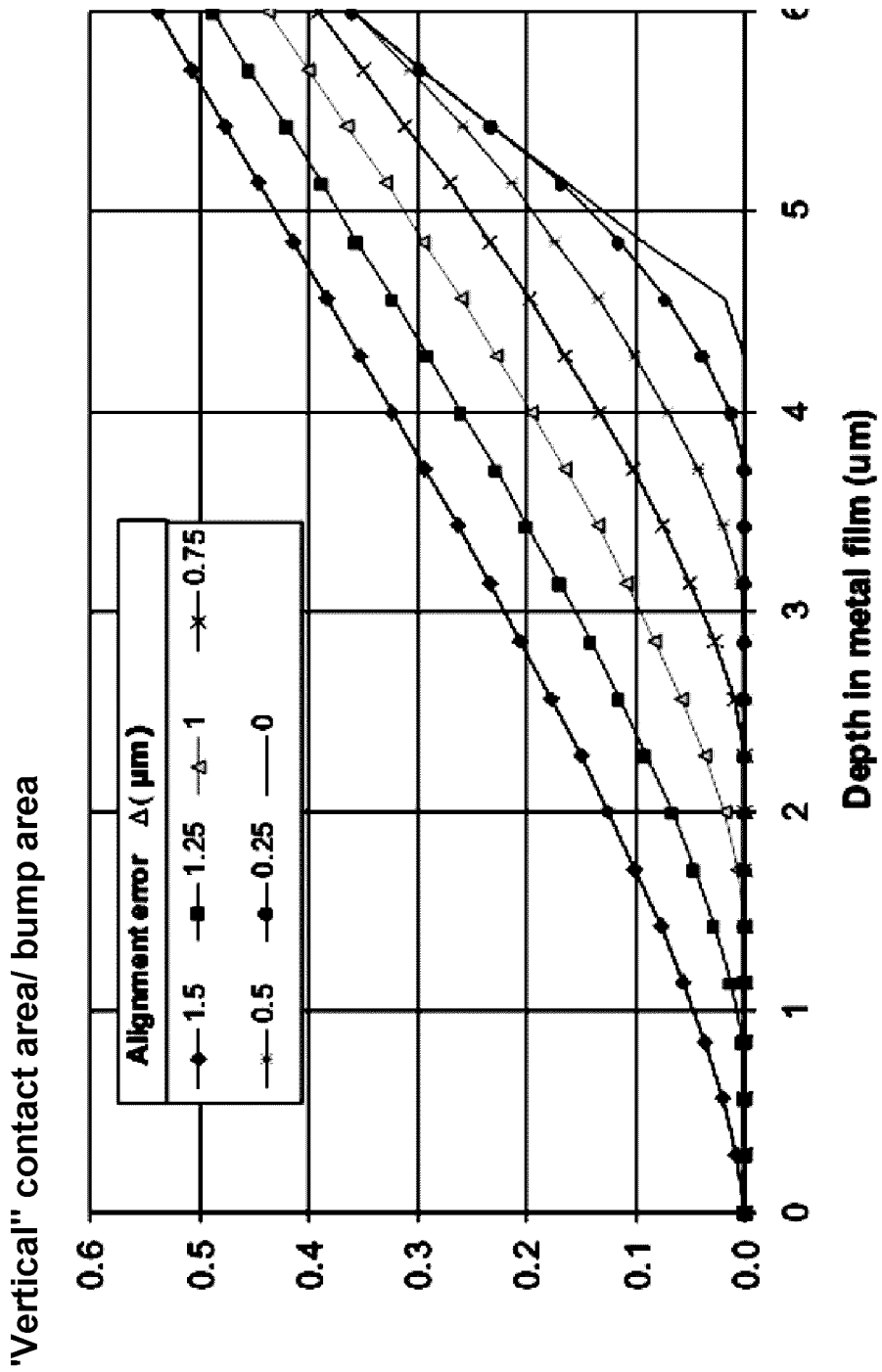
FIG. 9 illustrates the approximate vertical projection of the contact area between the protrusion and the pad during insertion bonding, normalized to the surface area of the bump area.
Figure 10:
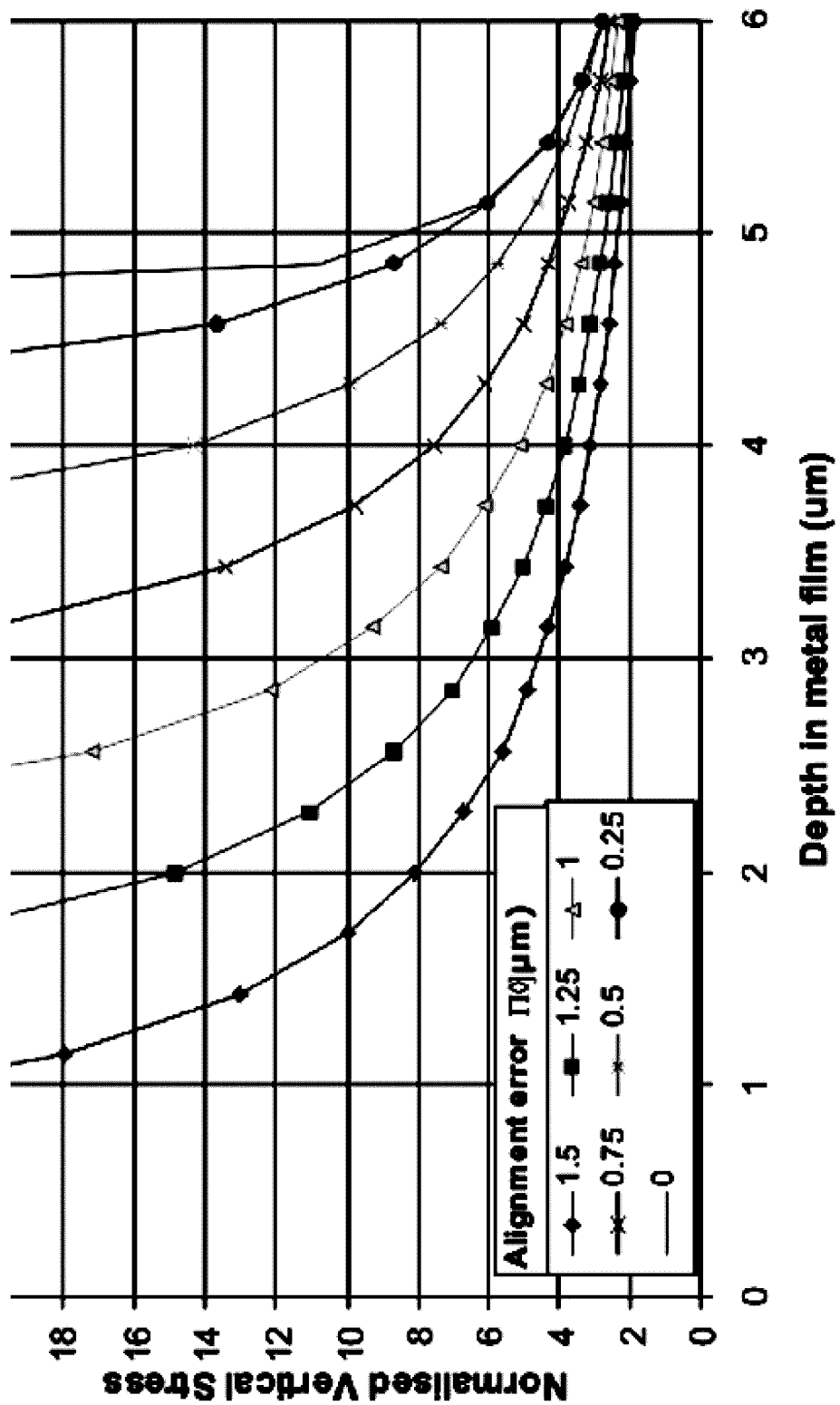
FIG. 10 illustrates the approximate vertical stress level during insertion bonding, normalized to the stress level during conventional thermo-compression bonding onto a flat metal surface.

For the 5 μm bump example discussed above, the approximate evolution of the vertical projection of the bonding surface is shown in FIG. 9. The impact of the alignment accuracy is also indicated (maximum 1.5 μm alignment error). In this graph, the bottom metal thickness Tm=6 μm, the top bump diameter $\varnothing_t=5$ μm and the diameter of the hole in the metal pad at the top $\varnothing_{bt}=8$ μm and at the bottom $\varnothing_b=4$ μm. Compared to a standard thermo-compression bond a much higher stress level (in the vertical direction) is obtained, as shown in FIG. 10.

In particular embodiments of the present disclosure, self-assembly techniques may be used to improve alignment of the first and second substrates prior to vertical displacement, i.e. prior to introduction of the bump structure into the corresponding hole. Self-alignment is typically performed in a wet environment, relying on surface tensions to obtain accurate alignment. The insertion bonding method according to embodiments of the present disclosure could be used to fix the aligned parts in place, avoiding any movement and loss of alignment during the removal of the alignment fluid e.g. by evaporation or drying.

Figure 6:
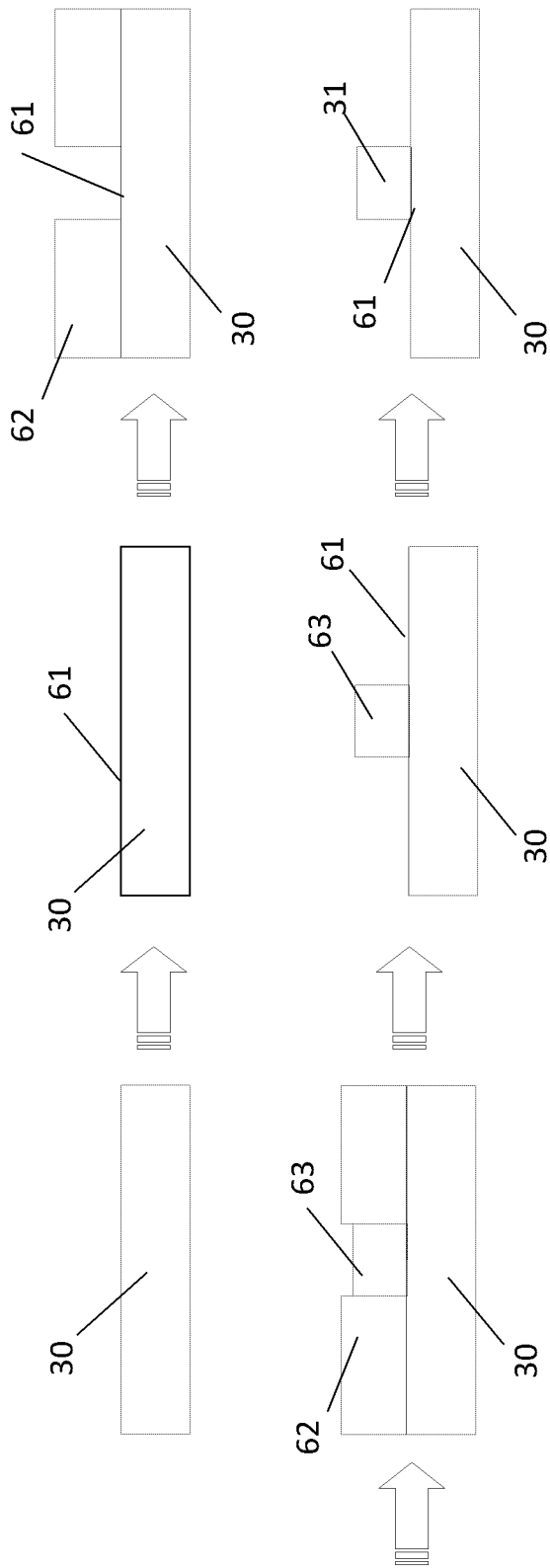
FIG. 6 illustrates the realization of a protrusion on a first substrate using a pattern electroplating method, the protrusion being for use in an insertion mounting method according to embodiments of the present disclosure.
Figure 7:
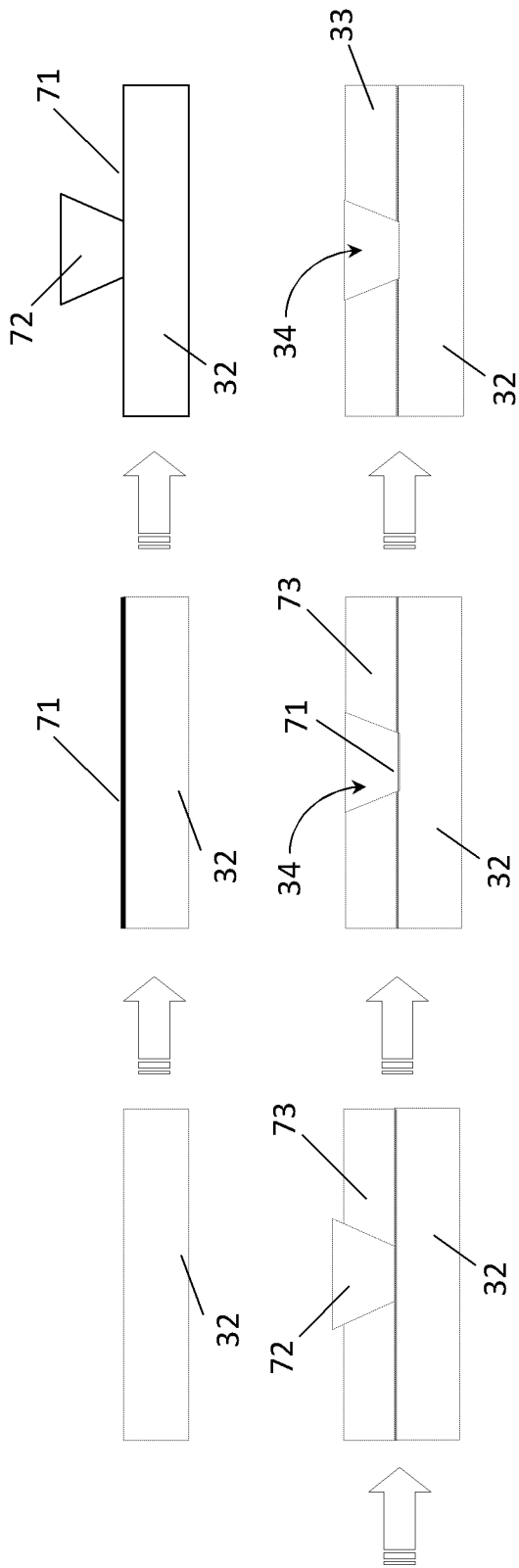
FIG. 7 illustrates the realization of a pad metal with controlled sloped hole using a pattern electroplating method, the pad metal being for use in an insertion mounting method according to embodiments of the present disclosure.

A possible fabrication method for the bump structure 31, e.g. metal stud, and layer 33 with hole 34 having sloping metal side walls, e.g. metal pad, is the use of pattern-plated metal deposition (e.g. Cu or Au and even soft metals such as In or Sn). The process flow for the metal stud 31 and pad 33 are depicted in FIG. 6 and FIG. 7, respectively. Both processes are similar.

For producing the bump structure 31, as illustrated in FIG. 6, in a first step a first substrate 30 is obtained. The first substrate 30 may include any underlying material or materials that may be used, or upon which a metal bump structure 31 may be formed. In embodiments of the present disclosure, this substrate may include a semiconductor substrate such as e.g. silicon, a gallium arsenide (GaAs), a gallium arsenide phosphide (GaAsP), an indium phosphide (InP), a germanium (Ge), or a silicon germanium (SiGe) substrate. The first substrate 30 may include for example one or more insulating layers such as $SiO_2$ or a $Si_3N_4$ layers in addition to a semiconductor substrate portion. The first substrate 30 may also include for example one or more conductive layers such as copper layers in addition to a semiconductor substrate portion. The term substrate is thus used to define generally the elements for layers and components that underlie a layer or portions of interest, in particular later on a metal bump structure 31. Also, the substrate may be any other base on which a metal bump structure 31 is formed, for example a glass, quartz, fused silica or metal foil. In embodiments of the present disclosure the substrate may be a singulated die from a wafer, an entire wafer or any other type of substrate. The substrate may comprise a large number of processed layers on a carrier. For instance, the substrate may be a Si-wafer, with integrated transistors in a back portion of the wafer, the so-called front-end-of-line (FEOL) structure, with subsequently processed interconnect layers, also called the back-end-of-the-line (BEOL) structure.

On the first substrate 30, a thin metal seed layer 61 is deposited, for example by PVD. The seed layer 61 may be a single layer or may in itself be a stack of layers, e.g. 30 nm Ti/150 nm Cu.

Next a photoresist layer is applied and patterned in a conventional way, so as to form a photoresist pattern 62. The photoresist pattern 62 may be such that it provides a hole where a bump structure 31 is to be provided. In the hole, the seed layer 61 is exposed.

In a next step, metal 63 is deposited on the exposed metal seed layers 61, for example by electroplating. After reaching the required metal thickness, i.e. for example a thickness equal to the desired height $H_t$ of the bump structure 31, the photoresist pattern 62 is removed from the wafer (stripped), exposing the seed layer metallization 61 in between the pattern plated metal structures 31. In alternative embodiments the bump structures, after having been electroplated but before the resist is stripped, may be planarized by any suitable method, for example by fly cutting (not illustrated in the drawings).

Using a removal step, e.g. a short wet etching step, this thin seed layer 61 may be etched where exposed, while only minimally etching the pattern plated metal layers 63. The result of this process is a metallic bump structure 31 on the first substrate 30.

For producing the hole 34, as illustrated in FIG. 7, in a first step a second substrate 30 is obtained. The second substrate 32 may include any underlying material or materials that may be used, or in which a hole 34 may be formed. In embodiments of the present disclosure, this substrate may include a semiconductor substrate such as e.g. silicon, a gallium arsenide (GaAs), a gallium arsenide phosphide (GaAsP), an indium phosphide (InP), a germanium (Ge), or a silicon germanium (SiGe) substrate. The second substrate 32 may include for example one or more insulating layers such as $SiO_2$ or a $Si_3N_4$ layers in addition to a semiconductor substrate portion. The second substrate 32 may also include for example one or more conductive layers such as copper layers in addition to a semiconductor substrate portion. The term substrate is thus used to define generally the elements for layers and components that underlie a layer or portions of interest, in particular a layer having a hole 34. In embodiments of the present disclosure the substrate may be a singulated die from a wafer, an entire wafer or any other type of substrate. The substrate may comprise a large number of processed layers on a carrier. For instance, the substrate may be a Si-wafer, with integrated transistors in a back portion of the wafer, the so-called front-end-of-line (FEOL) structure, with subsequently processed interconnect layers, also called the back-end-of-the-line (BEOL) structure.

On the second substrate 32, a thin metal seed layer 71 is deposited, for example by PVD. The seed layer 71 may be a single layer or may in itself be a stack of layers, e.g. 30 nm Ti/150 nm Cu.

Next a photoresist layer is applied and patterned in a conventional way, so as to form a photoresist pattern 72. The photoresist pattern 72 is negatively sloped, such that it provides a slanted structure where a hole 34 is to be provided in a layer 33 to be provided later. Such pattern may be obtained by tuning the exposure parameters of the photoresist. Where no photoresist layer is present after patterning, the seed layer 71 is exposed.

In a next step, metal 73 is deposited on the exposed metal seed layers 71, for example by electroplating. After reaching the required metal thickness, i.e. for example a thickness equal to the desired thickness of the layer 33, e.g. equal to the depth of the hole 34, the photoresist pattern 72 is removed from the wafer (stripped), exposing the seed layer metallization 71 in the hole 34 thus formed. In alternative embodiments the metal layer, after having been electroplated but before the resist is stripped, may be planarized by any suitable method, for example by fly cutting (not illustrated in the drawings).

Using a removal step, e.g. a short wet etching step, this thin seed layer 71 may be etched where exposed, while only minimally etching the pattern plated metal layers 73. The result of this process is a metallic layer 33 with a hole 34 on the second substrate 32.

Using the above method, the bump metallisation structure 31 would typically have a straight side wall profile, i.e. side walls which are placed substantially perpendicular to the plane of the first substrate 30. A negative profile, i.e. where the dimensions of a cross-section of the bump structure 31 further away from the first substrate 30 are larger than the dimensions of a cross-section closer to the first substrate 30, could also be of interest as it would allow for more deformation of the bump structure 31 during bumping, because a contact point between bump structure and sidewall of the hole is reached earlier. Positive side-wall profiles, i.e. where the dimensions of a cross-section of the bump structure 31 further away from the first substrate 30 are smaller than the dimensions of a cross-section closer to the first substrate 30, are only acceptable if they are significantly steeper than the slope of the corresponding hole 34.

Figure 8:
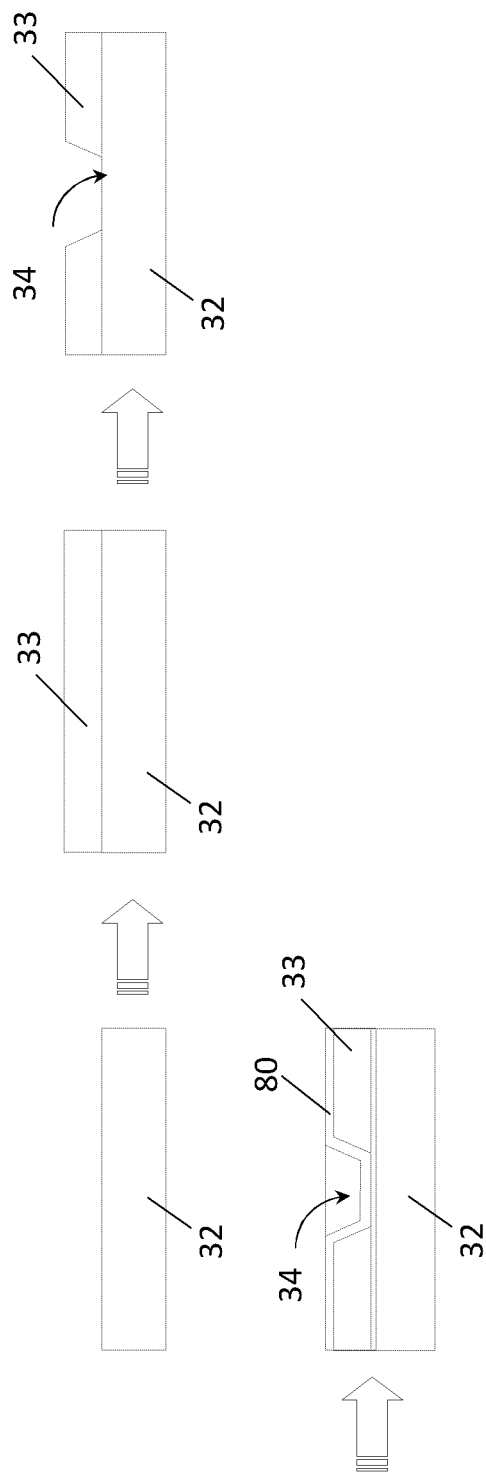
FIG. 8 illustrates an alternative method for realizing a pad metal with controlled sloped hole using a patterned first layer and deposition of a metal layer, the pad metal being for use in an insertion mounting method according to embodiments of the present disclosure.

An alternative method for realizing the bottom hole 34 with conductive side walls is illustrated in FIG. 8. It comprises obtaining a second substrate 32. The second substrate 32 may be as defined above.

On the substrate 32, a first layer 33 is provided. The first layer 33 consists of any suitable material, such as an insulating layer, for example, but not limited thereto, a semiconductor insulating layer e.g. $SiO_2$ or $Si_3N_4$. In alternative embodiments, the first layer 33 deposited could be metallic, polymeric or an oxy-nitride layer.

In a next step, a sloped hole 34 is provided, e.g. etched, in the first layer 33. This may be done by any suitable process as known by a person skilled in the art.

The provision of the sloped hole 34 is followed by a conformal metallisation 80 of the first layer 33. This may be obtained e.g. by electroplating. This includes providing a seed layer and patterning it so that it is present only where the metallisation layer 80 needs to be applied. The metallisation 80 may be patterned so that metal remains present substantially only on the sidewalls and bottom of the hole 34.

In all embodiments of the present disclosure, the sidewalls of the hole 34 comprise conductive material. Either the conductive material is the material of the first layer 33 itself, or it is a conductive material applied for covering the sidewalls.

While the disclosure has been illustrated and described in detail in the drawings and foregoing description, such illustration and description are to be considered illustrative or exemplary and not restrictive. The disclosure is not limited to the disclosed embodiments.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of correcting for alignment inaccuracies during bonding at least a first device to a second device, the method comprising:
providing a first device, comprising:
providing a first substrate having a front main surface; and
providing a protrusion over the first substrate at the front main surface,
wherein the protrusion comprises at least a metal portion and side walls perpendicular to the front main surface of the first substrate;
providing a second device, comprising:
providing a second substrate having formed thereon a metal seed layer;
forming a negatively sloped photoresist pattern on the metal seed layer;
depositing a metal layer directly in contact with the second substrate at exposed portions of the metal seed layer and surrounding the negatively sloped photoresist pattern, and subsequently removing the negatively sloped photoresist pattern such that a positively sloped hole is formed,
wherein the positively sloped hole is formed through the metal layer and does not extend into the second substrate,
wherein the positively sloped hole has smooth and uniformly sloped metal sidewalls as-formed,
wherein the positively sloped hole has a shape such that at least one of its dimensions in a cross-section parallel to a front main surface of the second substrate is continuously reduced in a depth direction,
wherein the positively sloped hole has at least one bottom dimension in a cross-section parallel to the front main surface of the second substrate that is smaller than a corresponding dimension of the protrusion in a cross-section parallel to the front main surface of the first substrate, and
wherein the positively sloped hole has at least one top dimension in the cross-section parallel to the front main surface of the second substrate that is larger than a corresponding dimension of the protrusion in the cross-section parallel to the front main surface of the first substrate;
aligning the protrusion of the first substrate with the positively sloped hole of the second substrate, comprising:
positioning the protrusion and the positively sloped hole laterally within an alignment tolerance dimension measured in a direction parallel to the front main surface of the first substrate,
wherein a sum of twice the alignment tolerance dimension and a corresponding dimension of the protrusion is smaller than the at least one top dimension of the positively sloped hole; and
clamping the first and second devices by inserting the protrusion of the first substrate into the positively sloped hole of the second substrate, the protrusion being arranged and constructed to be plastically deformed during insertion thereof in the positively sloped hole so as to provide a bond between the smooth and uniformly sloped metal sidewalls of the positively sloped hole and the metal portion of the protrusion.

2. The method according to claim 1, wherein providing the bond comprises forming a direct metallic bond between the metal portion of the protrusion and the smooth and uniformly sloped metal sidewalls of the positively sloped hole.

3. The method according to claim 1, wherein the metal portion of the protrusion is formed by a metal surface layer.

4. The method according to claim 1, wherein the second substrate has a back main surface opposite the front main surface, and the positively sloped hole tapers off from the front main surface to the back main surface.

5. The method according to claim 1, wherein a diameter of the protrusion is smaller than the entrance diameter of the positively sloped hole and larger than a further diameter of the positively sloped hole.

6. The method according to claim 1, wherein the second substrate has a back main surface opposite the front main surface, the method further comprising forming a gap between the back main surface of the second device and the front main surface of the first device.

7. The method according to claim 6, further comprising partially filling the gap between the first and second devices with a filler material.

8. The method according to claim 7, wherein the filler material is arranged in the gap to provide a thermal contact between wafers or dies in a stack formed by the first and second devices.

9. The method according to claim 7, wherein the gap is partially filled after the first and second devices are bonded.

10. The method according to claim 1, wherein the maximum diameter of the protrusion is between about 1 µm and 15 µm larger than the minimum diameter of the positively sloped hole.

11. The method according to claim 1, wherein the metal portion of the protrusion or the metal layer of the positively sloped hole comprises a metal chosen from the group consisting of Au, Ni, Pd, Co and Cu.

12. The method according to claim 1, wherein the positively sloped hole is approximately conical.

13. The method according to claim 1, wherein the height of the protrusion is larger than a depth of the positively sloped hole.

14. The method according to claim 1, wherein the method is repeated at least twice to form a stack of three or more devices.

15. The method according to claim 1, wherein the first and second device each comprises a singulated die or a wafer.

16. The method according to claim 1, wherein the protrusion is approximately cylindrical.

17. The method of claim 1, wherein depositing the metal layer comprises electroplating a single metal layer.

18. The method of claim 17, further comprising, after removing the photoresist pattern, removing the metal seed layer from an exposed bottom surface of the positively sloped hole such that the metal seed layer does not extend into the exposed bottom surface of the positively sloped hole.

19. The method of claim 18, wherein the metal seed layer is formed of at least one of Cu and Ti.

* * * * *

UNITED STATES PATENT AND TRADEMARK OFFICE
CERTIFICATE OF CORRECTION

PATENT NO. : 9,508,665 B2
APPLICATION NO. : 12/831919
DATED : November 29, 2016
INVENTOR(S) : Eric Beyne et al.

Page 1 of 1

It is certified that error appears in the above-identified patent and that said Letters Patent is hereby corrected as shown below:

In the Claims

In Column 14 at Line 19, In Claim 5, after "than" change "the" to --an--.

In Column 14 at Line 46, In Claim 13, after "wherein" change "the" to --a--.

Signed and Sealed this
Ninth Day of May, 2017

Michelle K. Lee
*Director of the United States Patent and Trademark Office*